(12) United States Patent
Berger et al.

(10) Patent No.: US 6,809,350 B1
(45) Date of Patent: Oct. 26, 2004

(54) QUANTUM WELL DETECTOR WITH LAYER FOR THE STORAGE OF PHOTO-EXCITED ELECTRONS

(75) Inventors: Vincent Berger, Paris (FR); Philippe Bois, Cesson (FR)

(73) Assignee: Thomson-CSF, Paris (FR)

(*) Notice: Subject to any disclaimer, the term of this patent is extended or adjusted under 35 U.S.C. 154(b) by 0 days.

(21) Appl. No.: 09/328,391

(22) Filed: Jun. 9, 1999

(30) Foreign Application Priority Data

Jun. 23, 1998 (FR) .............................................. 98 07914

(51) Int. Cl.$^7$ .......................................... H01L 21/338
(52) U.S. Cl. ..................................... 257/185; 257/189
(58) Field of Search ........................... 257/17, 21, 185, 257/11, 189, 200, 201, 615, 745, E31.019, E31.026, E31.059, E33.049, E33.023, E33.037, E27.012

(56) References Cited

U.S. PATENT DOCUMENTS

| | | | | |
|---|---|---|---|---|
| 4,353,081 A | * | 10/1982 | Allyn et al. ................... | 357/16 |
| 4,518,979 A | * | 5/1985 | Dumke et al. ................ | 357/30 |
| 5,041,882 A | * | 8/1991 | Katoh ......................... | 29/205 |
| 5,086,327 A | | 2/1992 | Rosencher et al. | |
| 5,187,715 A | | 2/1993 | Weisbuch et al. | |
| 5,228,777 A | | 7/1993 | Rosencher et al. | |
| 5,296,699 A | * | 3/1994 | Deveaud-Pledran et al. .......................... | 250/214 |
| 5,326,984 A | | 7/1994 | Rosencher et al. | |
| 5,429,957 A | * | 7/1995 | Matsuno et al. ............ | 438/312 |
| 5,506,418 A | | 4/1996 | Bois et al. | |
| 5,510,627 A | * | 4/1996 | Snow .......................... | 257/21 |
| 5,677,544 A | | 10/1997 | Duboz et al. | |
| 5,684,817 A | | 11/1997 | Houdre et al. | |
| 5,712,499 A | | 1/1998 | Duboz et al. | |
| 5,719,670 A | | 2/1998 | Duboz et al. | |
| 5,726,500 A | | 3/1998 | Duboz et al. | |
| 5,739,949 A | | 4/1998 | Rosencher et al. | |
| 5,812,190 A | | 9/1998 | Audier et al. | |
| 5,869,844 A | | 2/1999 | Rosencher et al. | |
| 5,953,479 A | * | 9/1999 | Zhou et al. ................... | 357/16 |
| 5,998,777 A | | 12/1999 | Audier et al. | |
| 6,037,616 A | * | 3/2000 | Amamiya .................... | 257/198 |

FOREIGN PATENT DOCUMENTS

| | | | | |
|---|---|---|---|---|
| EP | 0 422 990 | | 4/1991 | |
| EP | 0 478 060 | | 4/1992 | |
| EP | 0 509 247 | | 10/1992 | |
| EP | 0 557 186 | | 8/1993 | |
| JP | 361054673 | * | 3/1986 | ................. 257/194 |
| JP | 406252176 | * | 9/1994 | |

OTHER PUBLICATIONS

J. Y. Duboz, et al., "Effect of Asymmetric Barriers on Performance of GaAs/AlGaAs Quantum Well Detectors," Journal of Applied Physics, vol. 78, No. 4, (Aug. 15, 1995), pp. 2803–2807.

B. F. Levine, "Quantum–Well Infrared Photodetectors," Journal of Applied Physics, vol. 74, No. 8, (Oct. 15, 1993), pp. R1–R81.

B. Vinter, "Detectivity of a Three–Level Quantum–Well Detector," IEEE Journal of Quantum Electronics, vol. 30, No. 1 (Jan. 1994), pp. 115–118.

K. W. Goossen, et al., Applied Physics Letters, vol. 52, No. 20, pp. 1701–1703, "Photovoltaic Quantum Well Infrared Detector", , May 16, 1988.

* cited by examiner

Primary Examiner—Tom Thomas
Assistant Examiner—Paul E Brock, II
(74) Attorney, Agent, or Firm—Oblon, Spivak, McClelland, Maier & Neustadt, P.C.

(57) ABSTRACT

A quantum well made out of a the stack of layers of III–V semiconductor materials comprises, in addition to the quantum well, an electron storage layer separated from the quantum well by a transfer barrier layer. The barrier layer has a thickness that is greater than the thickness of the quantum well by about one order of magnitude. This barrier thus enables the separation of the absorption function (in the quantum well) and the function of reading the photocarriers (in the storage layer) and therefore the limiting of the rate of recombination of the carriers, thus improving the performance characteristics of the detector.

22 Claims, 8 Drawing Sheets

QUANTUM WELL DETECTOR WITH LAYER FOR THE STORAGE OF PHOTO-EXCITED ELECTRONS

BACKGROUND OF THE INVENTION

Field of the Invention

The field of the invention is that of electromagnetic wave detectors made with III–V semiconductor materials so as to define quantum well structures.

The working of such detectors is based on the occurrence of electronic transitions between permitted energy levels ($e_1$ and $e_2$) within the conduction bands of semiconductor quantum structures. FIG. 1a gives an example of this type of transition in a well having two discrete permitted energy levels for the electrons. By applying an electrical field to this type of configuration, it is possible to extract electrons from the well in giving preference to the electrons located at the second quantum level. Thus, through the collection, in the external electrical circuit, of these electrons coming from the second quantum level to which they have been carried by an illumination hv, it is possible to detect this illumination.

To achieve high absorption of the illumination to be detected, it is possible to use a large number of wells within detectors based on this quantum principle. FIG. 1b shows a multiple-well configuration of this kind.

The problem encountered with the prior art structures, described here above, lies in the high rate of carrier recombination. This is due especially to a barrier layer between successive wells. This barrier layer has a small thickness which is close to that of the quantum wells.

Photovoltaic variants of these detectors have been proposed in the literature [see Borge VINTER, "Detectivity of a three-level quantum well detector", IEEE Journal of Quantum Electronics, Vol. 30, p. 115 (1994)].

The problem encountered with prior art structures, as described here above, lies in the high rate of carrier recombination.

This recombination restricts the performance characteristics of these detectors and especially their operating temperature.

In the case of the photovoltaic device, this limitation is due to an excessively thin barrier layer between the two neighboring wells constituting the photovoltaic structure.

To place substantial limits on the recombination rate of the carriers, the invention proposes the introduction, in the detector, of a storage layer different from the absorbent layer (quantum well), and to do so by means of a transfer barrier with a great width as compared with that of the quantum well. By thus separating the absorption function (in the quantum well) and the photocarrier read function (in a storage layer), the performance characteristics of the detectors are improved through prevention of the recombinations of carriers.

To enable the flow of the photo-excited electrons in a storage layer, the transfer barrier has a conduction potential profile that shows a decrease starting with the quantum well.

SUMMARY OF THE INVENTION

More specifically, an object of the invention is an electromagnetic wave detector comprising a stack of layers made of III–V semiconductor materials, the conduction band profile of said materials defining at least one quantum well, said quantum well having at least one first discrete energy level populated with electrons that are capable of passing to a second energy level under the absorption of an electromagnetic wave and means for the reading of said electrons in the second energy level wherein the stack of layers of semiconductor materials furthermore comprises an electron storage layer separated from the quantum well by a transfer barrier layer, the thickness of the transfer barrier layer being about one order of magnitude greater than the thickness of the quantum well, the lower energy level of the conduction band of the transfer barrier layer being greater than those of the quantum well and the electron storage layer and decreasing from the quantum well to the electron storage layer so as to further the flow of electrons from the second energy state to the electron storage layer.

Thus, the detector of the invention comprises:
- a quantum well having an intersubband absorption at the desired energy, this layer being quite similar to the quantum wells commonly used in the quantum well detectors [B. LEVINE, "Quantum well infrared photodetectors", Journal of Applied Physics, Volume 74, No. 8, R1. (1993)];
- a transfer barrier that behaves like a loss of potential in which the photo-excited electrons may be transferred;
- a layer for the storage of the photo-excited electrons;
- means for reading the photosignal.

According to a first variant of the invention, the transfer barrier may consist of a semiconductor alloy whose composition varies along the thickness of said barrier so that the conduction potential decreases with distance from the well.

According to a second variant of the invention, the transfer barrier may be made out of piezoelectric material that generates a natural electrical field, enabling the conduction potential of the transfer barrier to be given the required profile.

According to a third variant of the invention, the semiconductor structure may also be placed directly under an electrical field to obtain the desired conduction potential profile for the transfer barrier.

Furthermore, the reading of the photodetection signal may be done differently.

It may relate, for example, to a measurement of parallel photocurrent using ohmic contacts that contact the storage layer without contacting the absorbent quantum well.

It may also be a photovoltaic reading of the voltage due to the spacing between the electrons in the storage layer and the layer of the absorbent well.

BRIEF DESCRIPTION OF THE DRAWINGS

The invention will be understood more clearly and other advantages will appear from the reading of the following description, given by way of a non-restricted embodiment with reference to the appended figures, of which.

MORE DETAILED DESCRIPTION

Figure 1A:
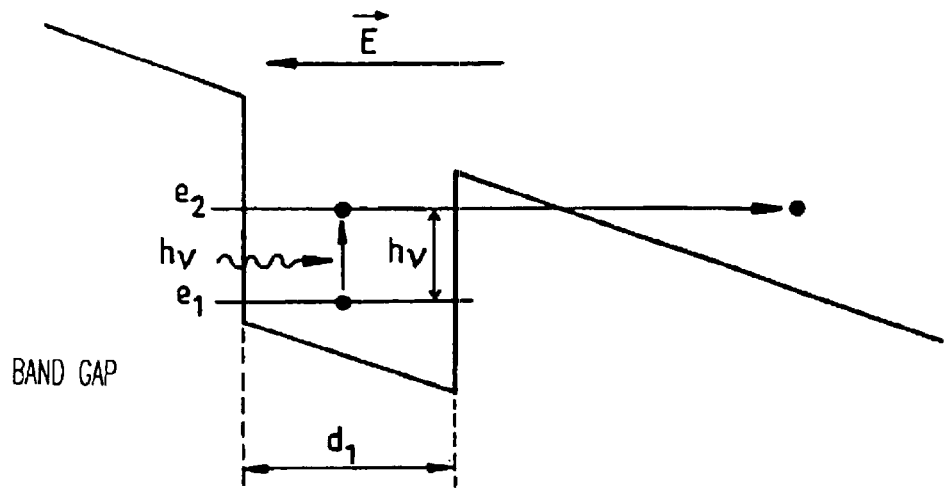
FIG. 1a gives a schematic view of an electromagnetic wave detection device comprising a quantum well, according to the prior art.
Figure 1B:
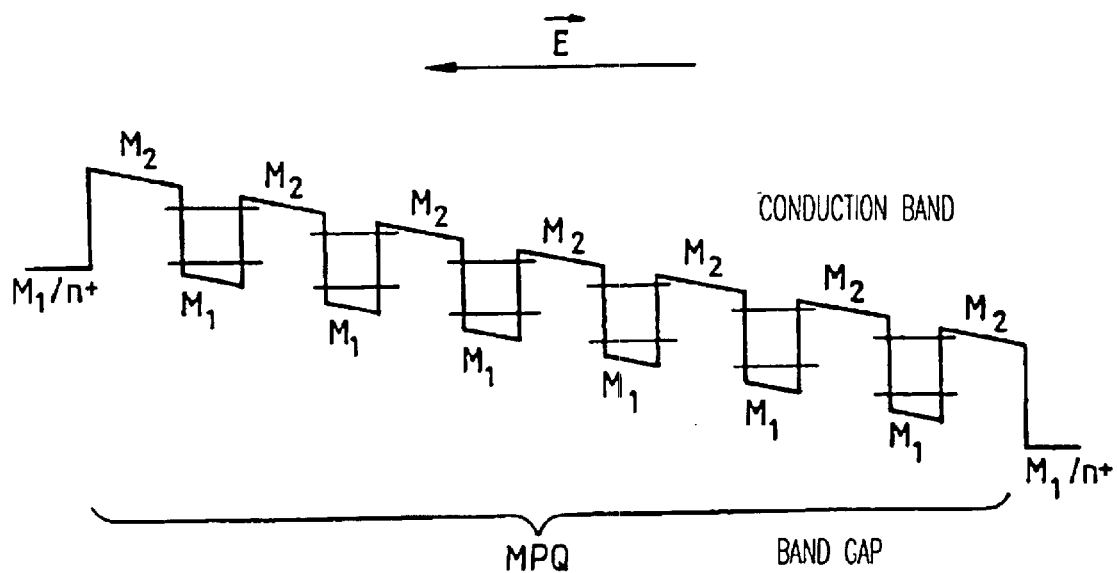
FIG. 1b gives a schematic view of a multiple quantum well structure used in prior art detection devices.
Figure 2:
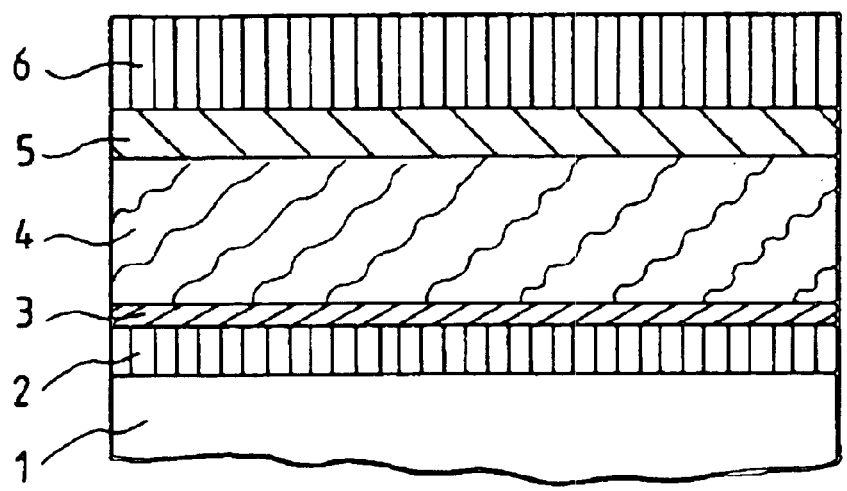
FIG. 2 illustrates a stack of semiconductor layers used in a detector according to the invention.

In general, the detector according to the invention comprises a stack of semiconductor layers comprising especially as shown in FIG. 2:

- a substrate 1;
- a first barrier layer 2 to confine the electrons in the quantum well;
- a constituent layer of the quantum well 3;
- a second barrier layer 4 that is a transfer barrier layer with an inclined conduction band profile;
- a layer 5 for the storage of photo-excited electrons;
- a third barrier layer 6.

Figure 3:
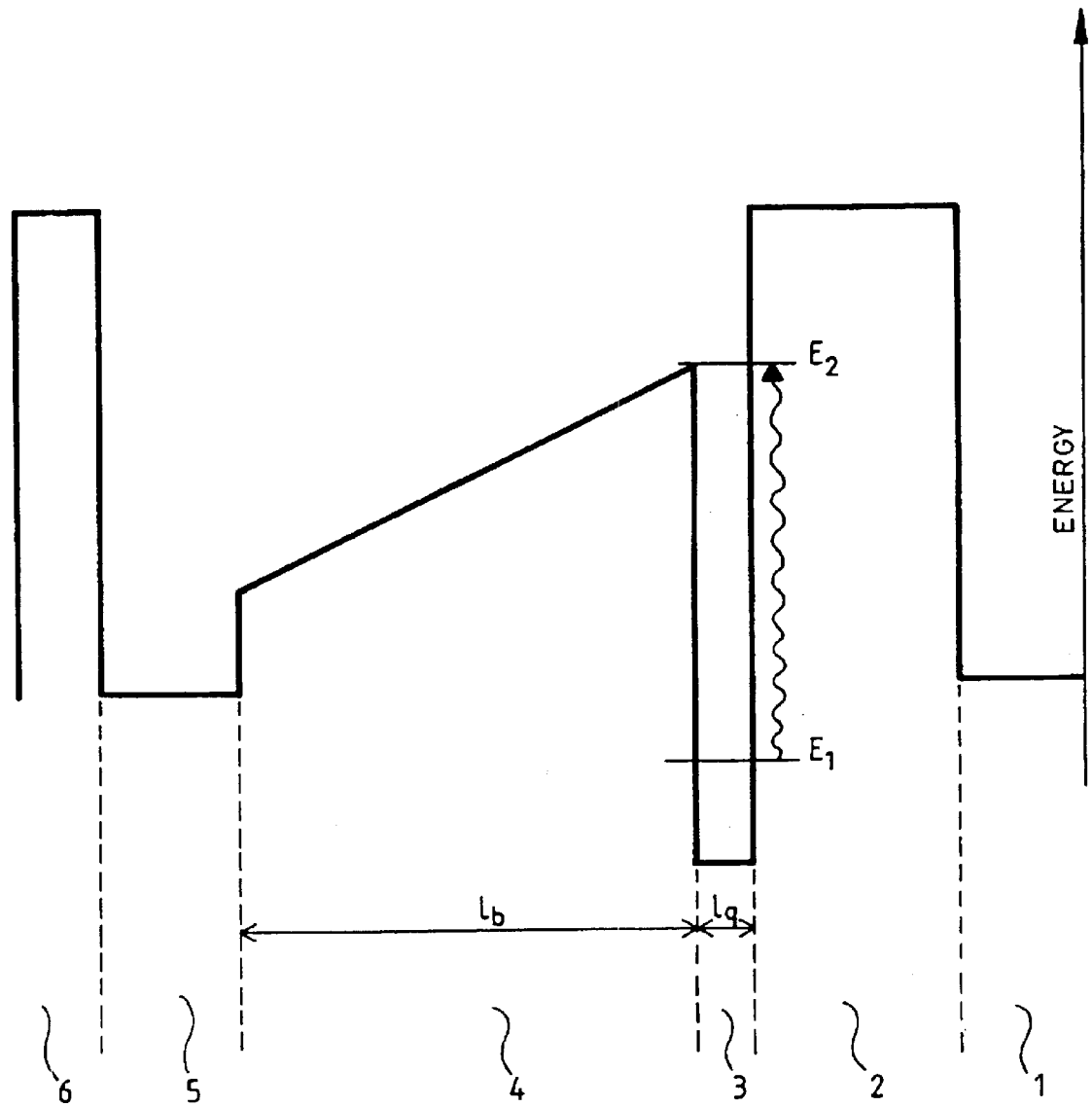
FIG. 3 illustrates the profile of the conduction bands of the stack of layers mentioned above.

FIG. 3 illustrates the conduction band profile of the above-mentioned stack of layers.

Typically, there is an order of magnitude between the width of the quantum well $I_q$ and the width of the transfer barrier $I_b$ to prevent possible recombinations of the photo-excited electrons.

Indeed, the transfer barrier may be very thick, as the electrons captured in the storage layer remain there for a very long time (from periods ranging some $\mu s$ to some ms). Indeed, the carriers take very long to return to equilibrium in the quantum well by tunnel effect in passing through the very thick transfer barrier (it is possible to chose a thickness of several hundreds of nanometers if desired). The gain in photoconductivity is therefore very high if we compare this time with the lifetime of the photo-excited electrons in the standard quantum well detectors (in the range of 1 ps).

To read the photodetection signal, it is possible to use two methods that we shall describe here below.

1st Method: Measurement of the Parallel Photocurrent

Figure 4:
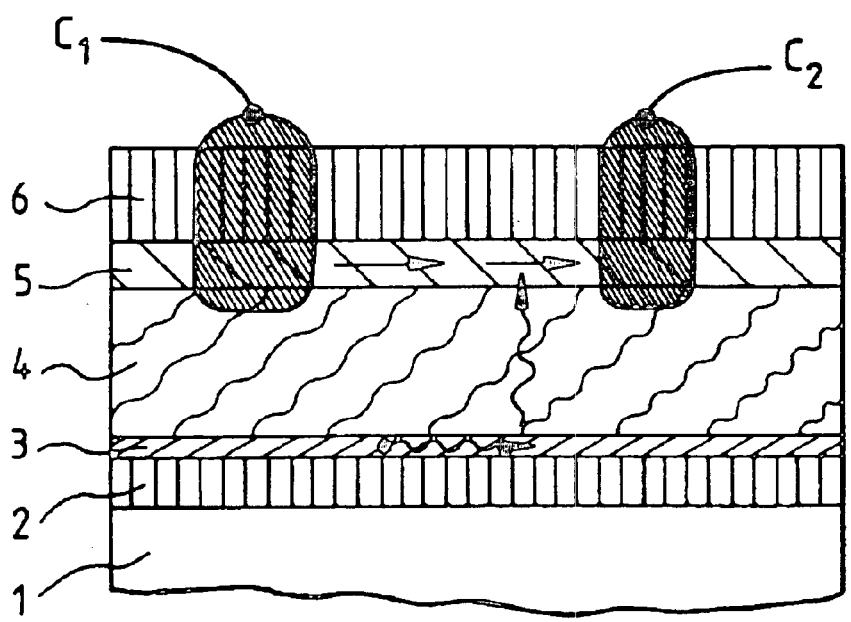
FIG. 4 illustrates a first example of means for the reading of photo-excited electrons in a measurement of parallel photocurrent in a detector according to the invention.

This measurement is made in the plane of the electron storage layer. For this purpose, first and second ohmic contacts make contact with the storage layer without contacting the absorbent quantum well as shown in FIG. 4 which again shows the stack of layers of semiconductor materials shown in FIG. 2. FIG. 4 also shows the ohmic contacts $C_1$ and $C_2$. The arrows illustrate the routing of the electrons and their flow from the quantum well 3 to the storage layer 5 in which they are collected by means of the contacts $C_1$ and $C_2$. This assumes that the thickness of the transfer barrier is great enough for the diffusion of the ohmic contact to make contact with the storage layer without reaching the absorbent quantum well. This photocurrent is parallel to the number of electrons captured and the time for reading it is very long if compared with the standard quantum well detectors. Since the storage layer is not doped, the current is very weak without illumination of the structure since this layer contains very few carriers in a state of thermodynamic equilibrium. The illumination of the structure sends electrons to the excited level $E_2$ of the absorbent quantum well. A part of these electrons travel to the storage layer through the transfer barrier. The conductivity of the storage layer then increases enormously. Thus, at a conceptual level, there is an optically controlled transistor where the storage layer is the channel, the role of the gate is fulfilled by the optical beam to be detected and the source and the drain are the two electrodes between which the photocurrent is read. It must be stressed here that it is vitally important for the ohmic contacts not to reach the absorbent layer. There are known ways, by the diffusion of dopants, to make contacts that reach the storage layer without touching the absorbent well for a transfer barrier, between the two layers, having a thickness as fine as 500 Angstroms.

Figure 5:
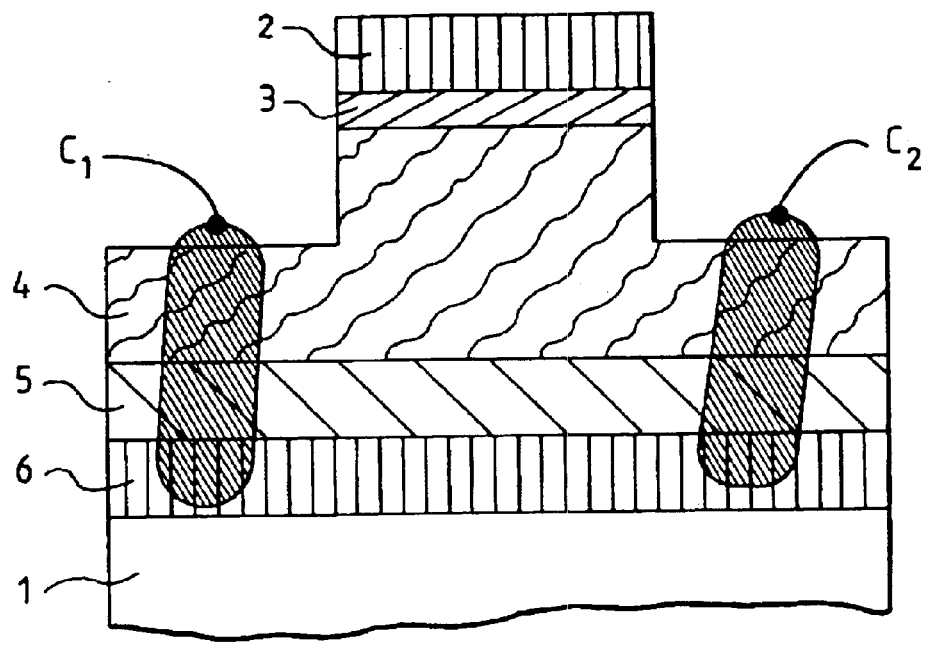
FIG. 5 illustrates a second example of the means of reading photo-excited electrons in a measurement of parallel photocurrent in the detector according to the invention.

Another geometry of contacts consists in making a mesa by a technology that is quite standard, and then contacting the storage layer beneath the quantum well. In this case, during the growth, the order of the layers has been reversed with respect to the previous approach. This approach has the advantage of not requiring control over the depth of the contact. The drawing is shown in FIG. 5 wherein the optically controlled transistor function appears more clearly.

Estimation of the Photocurrent at the End of 10 ms Storage:

With a typical flux of $10^{16}$ photons.cm$^{-2}$.s$^{-1}$, and an absorption of 5% in the unique quantum well (this is a common value for a quantum well provided with a surface diffraction grating), approximately $5.10^{14}$ electron per cm$^2$ and per second are placed at the level $E_2$ (excited state). Assuming that there is a probability of 1/2 that an electron will leave the transfer barrier and reach the storage layer (against a probability of 1/2 that it will fall back on the fundamental level of the well and therefore be of no use for the photodetection), this gives, in 10 ms of integration time, $2.5.10^{12}$ cm$^{-2}$ electrons transferred into the storage layer.

Figure 6:
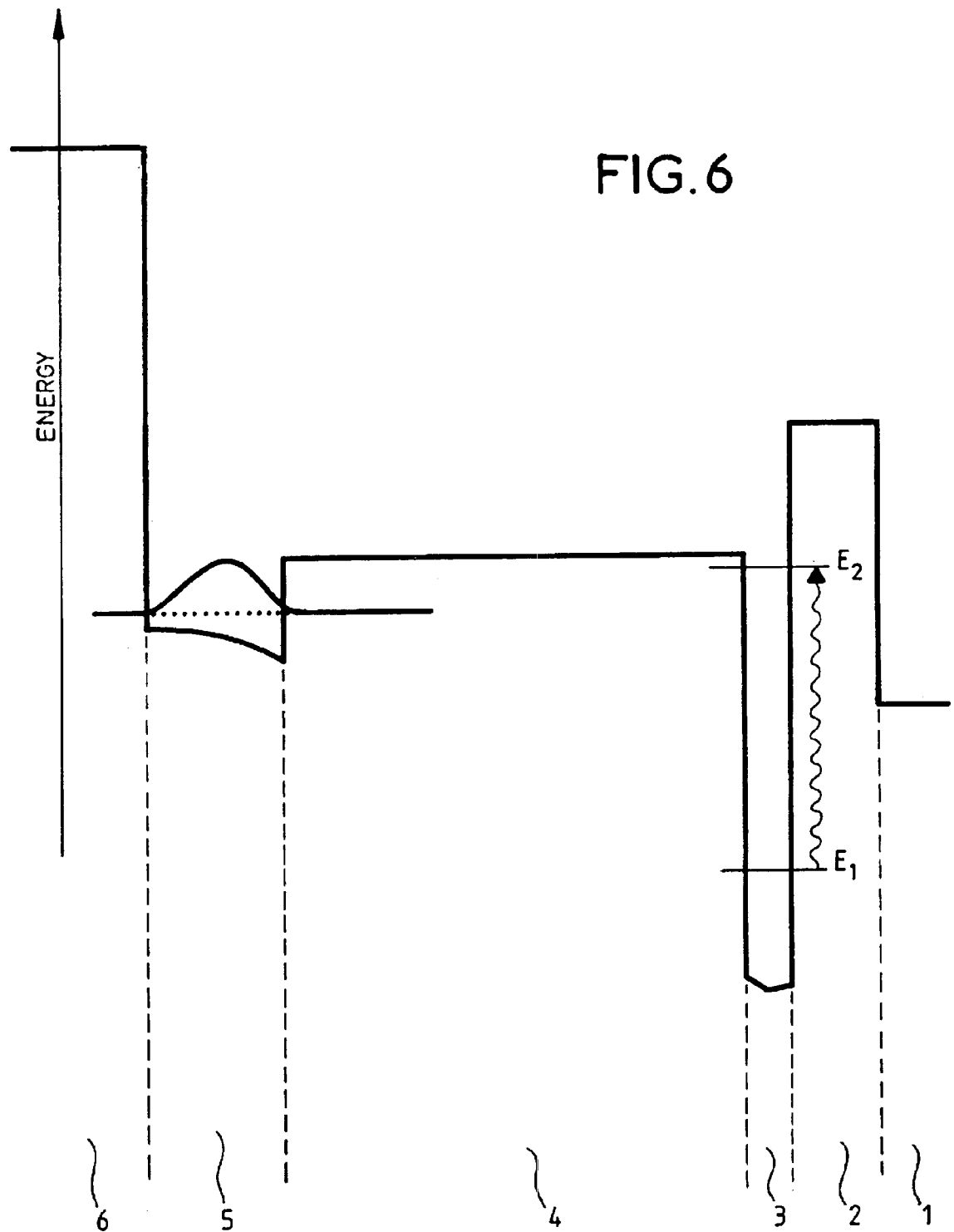
FIG. 6 illustrates the modified profile of the conduction bands of the stack of layers illustrated in FIG. 3, taking account of the space charge effects; the modification of this profile comes from the transfer of a population of electrons from the quantum well to the storage layer.

In reality, this model is far too simplistic and it is necessary to absolutely take account of the space charge effects in this structure where the electrons are transferred far from the dopant atoms. The space charge effects lead to a field induced in the transfer barrier and this barrier stops transferring the carriers when this induced field compensates for the loss of potential that naturally exists in the transfer barrier. Because of these space charge effects, the band structure is deformed and goes from the one shown in FIG. 3 to the one shown in FIG. 6.

To compute the maximum number of carriers transferable in the storage layer, the equilibrium between the field due to the space charge effects and the potential slope in the transfer barrier is written without transferred carriers. For a barrier like that of FIG. 2, this leads to a potential slope equal to 180 meV/500 Å=36 kv/cm.

The field due to the space charge effects is equal to $E=\rho_S e/\epsilon_0\epsilon_r$, where $\rho_S$ is the density of transferred electrons. By equalizing the two quantities, it is deduced that $\rho_s$ is about $2.5\ 10^{11}$ cm$^{-2}$.

In view of the above computations, it can be seen that the storage layer has been filled at the end of an integration time of about 500 $\mu s$ for the illumination levels given here above.

The storage layer then has an electrical resistance (for a standard pixel surface area used in the detectors, equal to 30

μm*30 μm) of R=L/NqμS 250 Ω. For this purpose, the value of mobility taken is $\mu=10^5$ cm$^2$ V$^{-1}$s$^{-1}$, which is current for GaAs transistor canals at 77 K. This resistance, which is very low, therefore corresponds to a 40 μA photocurrent for a bias of 1 mV between the source and the drain. These photocurrents are much greater than the photocurrents of the usual quantum well detectors owing to the increase in the gain of photoconductivity.

2nd Method: Photovoltaic Measurement

Figure 7:
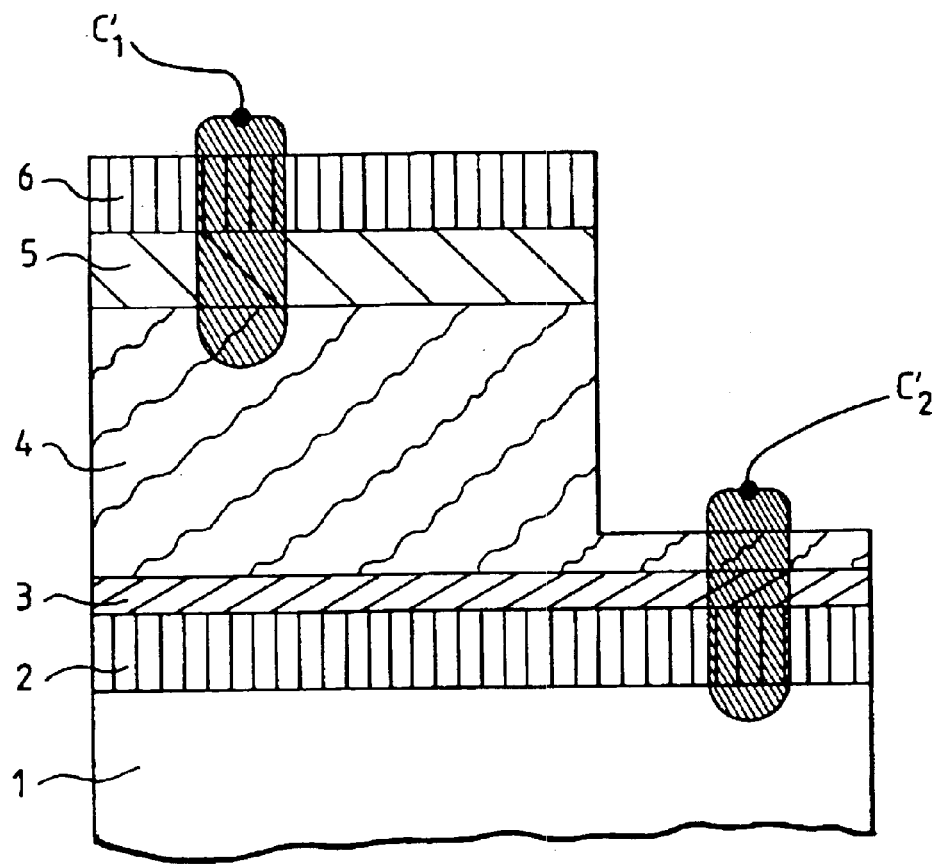
FIG. 7 illustrates an exemplary means for the reading of the photo-excited electrons in a photovoltaic measurement in a detector according to the invention.

In this case, a measurement is made of the voltage due to the spacing between the electrons in the storage layer and the layer of the absorbent well, which is doped, and this is done by means of two ohmic contacts taken respectively at the level of the storage layer (contact $C'_1$) and the level of the quantum well (contact $C'_2$) as shown in FIG. 7. A direct reading is made of the voltage which will range from 0 to 180 mV in the case of a barrier whose percentage of Al varies from 30% to 8% in an $Al_xGa_{1-x}As$ alloy. It must be noted that the maximum value of the voltage does not depend on the width of the storage layer. The effect of this width is above all the modification of the time of return to equilibrium by the electrons.

The maximum voltage of 180 mV (i.e. at saturation) will be measured for a typical flux of $10^{16}$ photons.cm$^{-2}$ during an integration time of about 500 μs. An integration time of 30 ms makes it possible to obtain a voltage of 180 mV for a very low photon flux: $2.10^{14}$ photons.cm$^{-2}$ only.

This type of detector will therefore be particularly well suited to detection in a spectral zone where there are few photons, such as the 3–5 μm zone for the infrared imaging of black bodies at 300 K.

The higher detectivity of this type of photovoltaic detector as compared with the quantum well photovoltaic detectors described earlier in the literature [B. VINTER, "Detectivity of a Three-Level Quantum Well Detector", IEEE Journal of Quantum Electronics, Vol. 30, p. 115 (1994)] results from two specific advantages.

1) An efficient capture rate in the storage layer: a high proportion of the carriers (for example half of them) are transferred to the storage layer through the potential slope present in the barrier layer. This potential slope herein plays a crucial role: it is this layer that makes it possible to have efficient transfer. Indeed, through this potential level, the electrons cannot rise and return, and cannot get recombined in the absorbent wells.

2) A lengthy time of return to equilibrium: the transfer barrier is very thick (for example 500 A) thus increasing the time of return of the carriers from their metastable level in the storage layer to their state of equilibrium in the quantum well. The gain is thus increased.

In any case, a perpendicular voltage may be applied to the device to force the electrons to return to the absorbent quantum well if it is desired to initialize the system between two measurements.

Figure 8:
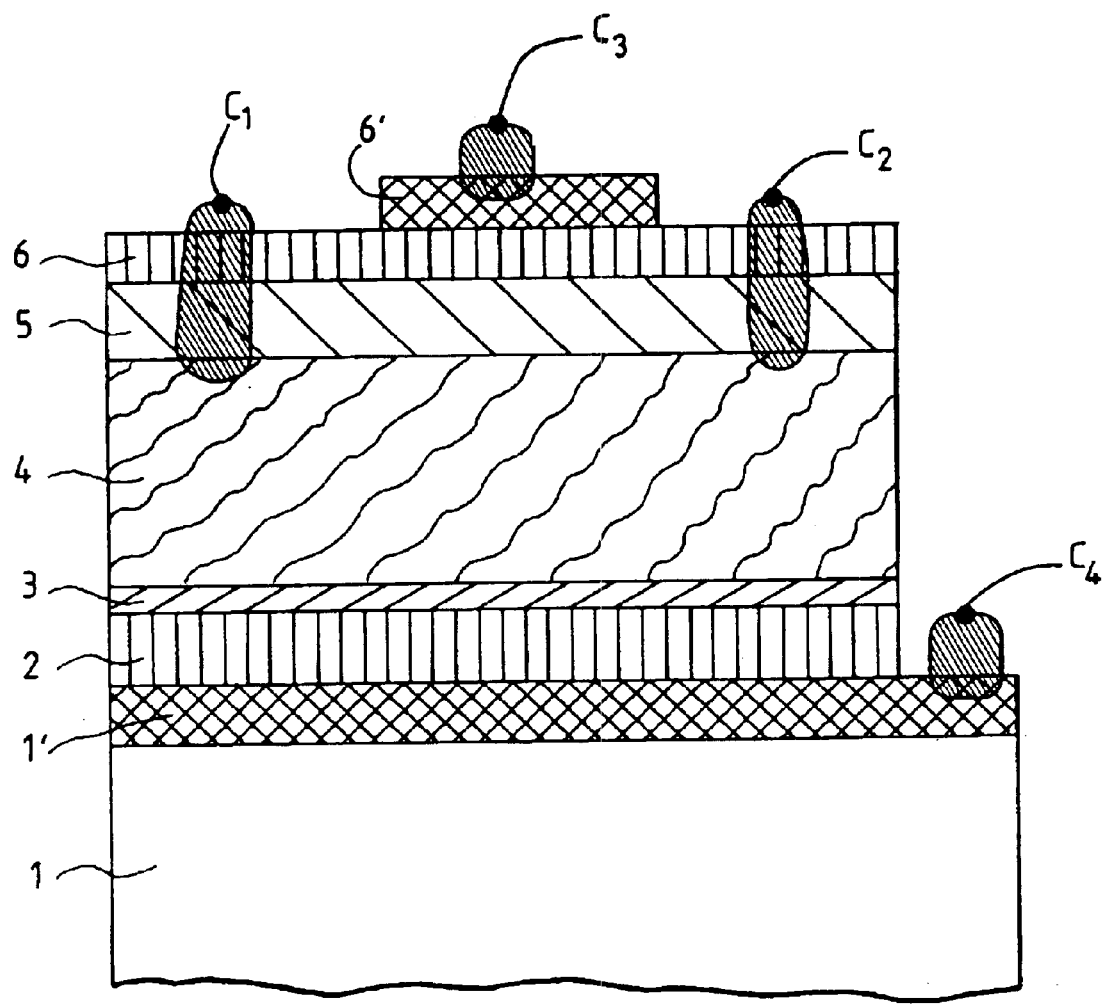
FIG. 8 illustrates a detector according to the invention comprising reading means in a measurement of parallel photocurrent and means for the resetting of the detector.

In the case of the first photoconductive reading method, it is necessary to add two n+ doped layers, 1' and 6' to the stack of layers (2→6) illustrated in FIGS. 4, 5, and 7, one on the top of the structure and the other below it. This then gives a four-contact device $C_1$, $C_2$, $C_3$, $C_4$ as shown in FIG. 8.

In the case of the second photovoltaic reading method, it is possible to stay with the drawing of FIG. 7, and only two contacts are kept. Two contacts are used for the reading of the voltage and for initializing the system.

This initializing principle may be used during the reading to set the number of electrons in the storage layer at the desired level. This makes it possible for example to set the potential energy in the storage layer with an offset such that the population of electrons is small under a given illumination. Through this offset, the detector reads only the variations of illumination with respect to the mean level of illumination. This is very valuable when the detector analyzes an average infrared scene at ambient temperature.

It must be reported that a certain number of possibilities may be used with the detectors described herein. They have not been described because they are not characteristic of the invention. We might simply cite the diffraction gratings etched on the top of the detector to couple the incident light at the intersubband transition of the absorbent well and thus obtain maximum absorption. (This is a very standard method in the literature.)

A more detailed description shall now be given of exemplary stacked structures that can be used in detectors according to the invention.

The first example of a stack of semiconductor layers that can be used in the invention is the one whose conduction band profile corresponds to the one shown in FIG. 3.

This is a configuration in which the transfer barrier is constituted by an alloy whose composition varies along the thickness to obtain the desired profile of the conduction potential of the transfer barrier.

According to this example the substrate 1 is made of GaAs, for example non-doped;

the barrier layer 2 is made of $Al_{0.44}Ga_{0.56}As$ with a thickness of 300 Å;

the quantum well; having two discrete energy levels $E_1$ and $E_2$, is made of $In_{0.15}Ga_{0.85}As$ and typically has a thickness Iq=30 Å;

the transfer barrier is made with the alloy $Al_yGa_{1-y}As$ having a thickness of 500 Å, the percentage therein varying linearly from 0.3 to 0.08, starting with the quantum well, making it possible to obtain a drop in potential varying from 250 meV to 70 meV in relation to the bottom of the GaAs conduction band;

the storage layer 5 is made with GaAs and has a thickness of 150 Å;

the layer 6 is made of $Al_{0.44}Ga_{0.56}As$ identical to the first barrier layer 2.

Thus, during an absorption to be detected, related to an optical transition, the electrons located on the energy level $E_1$ pass to the energy level $E_2$ and are then discharged through the transfer barrier into the storage layer in which they may accumulate.

In this example, the quantum well has a second discrete energy level $E_2$. It is also possible to use a structure in which the quantum well has only one discrete energy level. The optical transition can then take place between the energy level $E_1$ and the continuum of levels above the barrier as is known in the prior art.

The following is the second example of a stack of semiconductor layers

Figure 9:
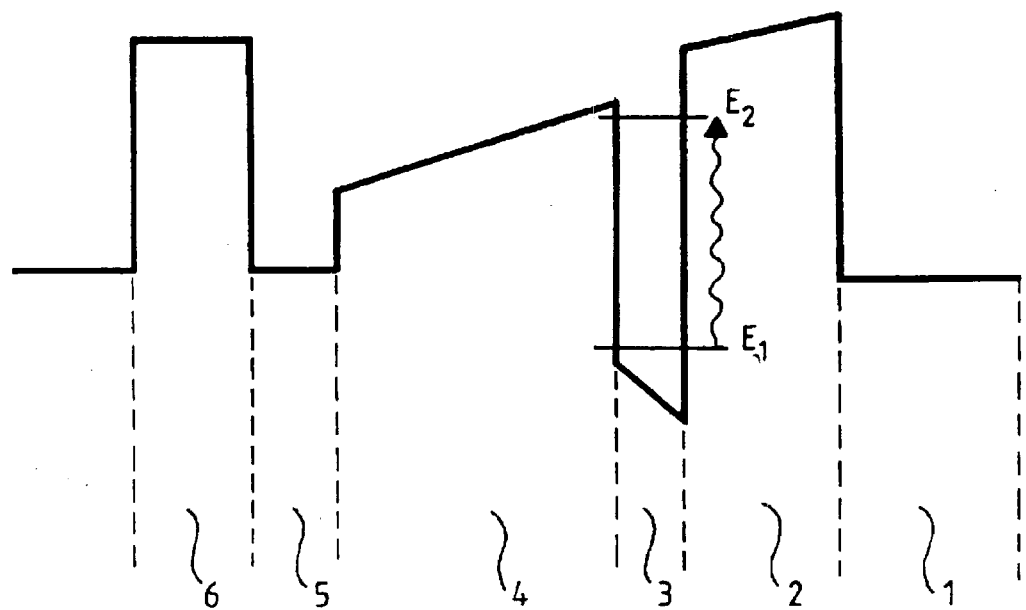
FIG. 9 illustrates a second exemplary conduction band used in a stack of layers of a detector according to the invention.

The detector can be obtained with a stack of semiconductor layers comprising a semiconductor material in which there naturally prevails an electrical field of piezoelectric origin. For example, a material of this kind may be formed by a quantum well made of $In_{0.2}Ga_{0.8}As$ on a GaAs substrate (111). The piezoelectric field present in the quantum well, which is about 100 kV/cm, results in the appearance of an electrical field also in the barriers, as can be seen in FIG. 9 showing the following stack of layers used in a second exemplary detector:

substrate 1: GaAs (111)
barrier layer 2: $Al_{0.44}Ga_{0.56}As$ and thickness=500 Å
quantum well 3: $Ga_{0.8}In_{0.2}As$ with Iq=40 Å
transfer barrier 4: $Al_{0.44}Ga_{0.78}As$ thickness=500 Å
storage layer 5: GaAs Is=100 Å
barrier layer 6: $Al_{0.44}Ga_{0.56}As$ and thickness=500 Å

Figure 10:
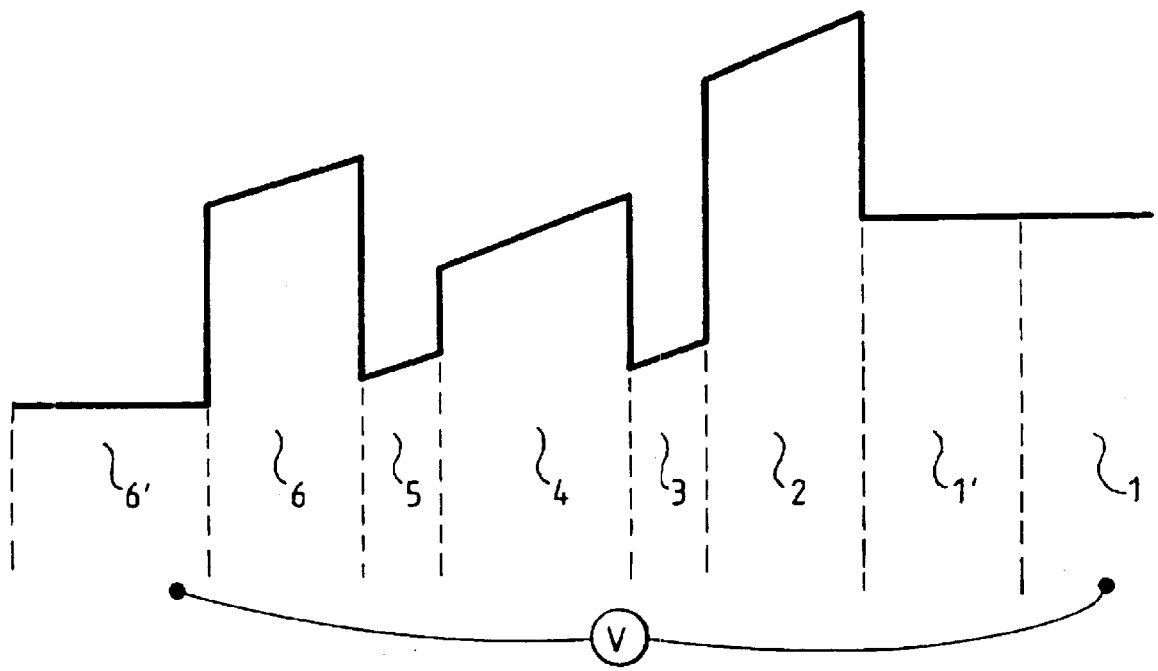
FIG. 10 illustrates a third exemplary conduction band profile used in a stack of layers of a detector according to the invention.

The following is the third example of stacking of semiconductor layers whose conduction band profile is shown in FIG. 10.

The stack of semiconductor layers of the invention is inserted between two ohmic contact layers to apply a voltage V that makes it possible to give the required profile to the transfer barrier. According to this example, there is therefore the following stack of semiconductor layers:

substrate 1: GaAs
Contact layer 1': GaAs n+ doped thickness=3 000 Å
Barrier layer 2 : $Al_{0.44}Ga_{0.56}As$ thickness=500 Å
Quantum well 3: $In_{0.15}Ga_{0.85}As$, Iq=35 Å
Transfer barrier layer 4: $Al_{0.22}Ga_{0.78}As$. $I_b$=500 Å
Storage layer 5 : GaAs thickness=100 Å
Barrier layer 6: $Al_{0.44}Ga_{0.56}As$ thickness=500 Å
Contact layer 6': GaAs n+ doped, thickness=1 000 Å

Figure 11:
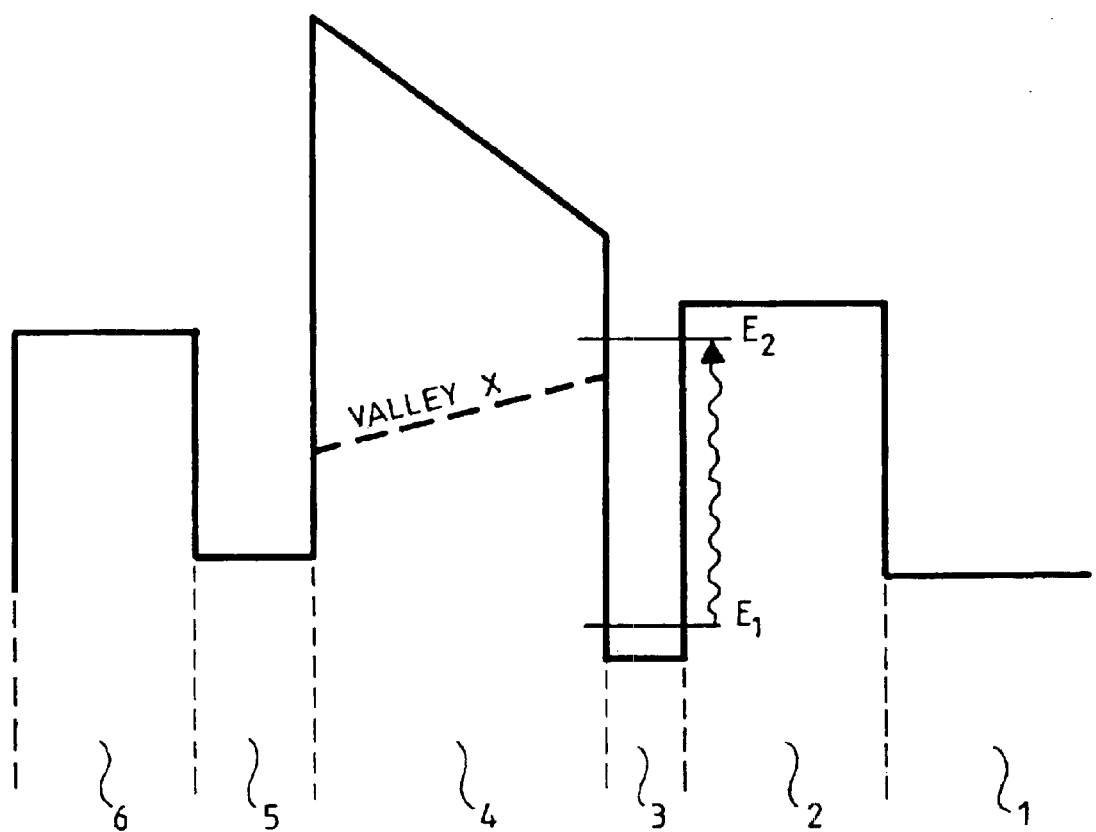
FIG. 11 illustrates a fourth exemplary conduction band profile used in a stack of layers of a detector according to the invention.

The following is the fourth exemplary stack of semiconductor layers whose conduction band profile is shown in FIG. 11.

This exemplary stack of semiconductor materials comprises a constituent material of the transfer barrier formed by an alloy whose composition varies and in which the transport of the electrons can be done through the valleys X as shown in FIG. 11. This type of behavior is obtained especially with an alloy of $Al_xGa_{1-x}As$ for which the percentage x increases from 0.44 to 1. In this case, the level of the valleys X in the material drops by about 320 meV in the material $Al_{0.5}Ga_{0.5}As$ to about 200 meV in the material AlAs as compared with the bottom of the conduction band. In this example, the substrate, the quantum well barrier layers and the storage layer may be identical to those of the example 1.

What is claimed is:

1. An electromagnetic wave detector comprising:
a stack of layers made of III–V semiconductor materials, a conduction band profile of said materials defining at least one quantum well, said quantum well having at least one first discrete energy level populated with electrons that are capable of passing to a second energy level under an absorption of an electromagnetic wave; and
means for counting said electrons in the second energy level,
wherein the stack of layers of semiconductor materials furthermore comprises a transfer barrier layer, and an electron storage layer separated from the quantum well by the transfer barrier layer, said electron storage layer includes a metastable level, and said transfer barrier layer includes a component having a concentration that varies linearly, decreasing in a direction from said quantum well to said electron storage layer, and
wherein a thickness of the transfer barrier layer is at least an order of magnitude greater than a thickness of the quantum well, a lowest energy level of a conduction band of the transfer barrier layer is greater than energy levels of the quantum well and the electron storage layer, and the conduction band profile of the stack of layers of semiconductor materials decreases from the quantum well to the electron storage layer so as to further a flow of electrons from the second energy level to the electron storage layer.

2. An electromagnetic wave detector according to claim 1, wherein the stack of layers made of III–V semiconductor materials furthermore comprises:
a first barrier layer; and
a third barrier layer, both of the first and third layers being made of semiconductor materials such that a lowest energy level of a conduction band of said both layers is respectively greater than a lowest energy level of the conduction band of the quantum well and of the electron storage layer.

3. An electromagnetic wave detector according to claim 1, wherein a decreasing profile of the lowest energy level of the conduction band of the transfer barrier layer is obtained with a semiconductor alloy having a composition varying from the quantum well to the electron storage layer.

4. An electromagnetic wave detector according to claim 1, wherein the counting means comprises:
a first ohmic contact; and
a second ohmic contact, both of the first and second ohmic contacts being located at the electron storage layer so as to carry out a measurement of photocurrent in a plane of the storage layer.

5. An electromagnetic wave detector according to claim 1, further comprising the following stack of layers of semiconductor materials, starting from a surface of a semiconductor substrate:
a first barrier layer;
a quantum well;
a second barrier layer that is a transfer barrier layer;
an electron storage layer;
a third barrier layer;
the first and second ohmic contacts extending from the third barrier layer up to the electron storage layer.

6. An electromagnetic wave detector according to claim 4, comprising the following stack of layers of semiconductor materials, starting from a surface of a semiconductor substrate:
a third barrier layer;
an electron storage layer;
a second barrier layer that is a transfer barrier layer;
an electron storage layer;
a first barrier layer;
and a mesa defined in:
the transfer barrier layer;
the quantum well;
the first barrier layer;
the first and second ohmic contacts being located on either side of the mesa.

7. An electromagnetic wave detector according to claim 1, wherein the means for counting electrons in the second energy level comprise a first ohmic contact and a second ohmic contact located respectively in the quantum well and in the electron storage layer so as to carry out a photovoltaic reading of a voltage set up between electrons of the quantum well and electrons of the storage well.

8. An electromagnetic wave detector according to claim 7, comprising the following stack of semiconductors materials starting from semiconductor substrate:
a first barrier layer;
a quantum well;
a second barrier layer that is a transfer barrier layer;

an electron storage layer;

a third barrier layer;

and an etching up to the level of the transfer barrier layer so as to make the first ohmic contact extending up to the quantum well and the second ohmic contact extending up to the electron storage layer.

9. An electromagnetic wave detector according to claim 1, further comprising means for resetting the flow of the electrons in the storage layer.

10. An electromagnetic wave detector according to claim 4, comprising third and fourth contacts located on either side of the slack of layers of semiconductor materials.

11. An electromagnetic wave detector comprising:

a stack of layers made of III–V semiconductor materials, a conduction band profile of said materials defining at least one quantum well, said quantum well having at least one first discrete energy level populated with electrons that are capable of passing to a second energy level under an absorption of an electromagnetic wave; and a counting unit configured to count said electrons in the second energy level, wherein the stack of layers of semiconductor materials furthermore comprises a transfer barrier layer, and an electron storage layer separated from the quantum well by the transfer barrier layer, wherein said electron storage layer includes a metastable level, said counting unit includes two electrodes in direct contact with said electron storage layer, and said two electrodes are separated from said quantum well, and wherein a thickness of the transfer barrier layer is at least an order of magnitude greater than a thickness of the quantum well, a lowest energy level of a conduction band of the transfer barrier layer is greater than energy levels of the quantum well and the electron storage layer, and the conduction band profile of the stack of layers of semiconductor materials decreases from the quantum well to the electron storage layer so as to further a flow of electrons from the second energy level to the electron storage layer.

12. An electromagnetic wave detector according to claim 11, wherein the stack of layers made of III–V semiconductor materials furthermore comprises:

a first barrier layer; and a third barrier layer, both of the first and third layers being made of semiconductor materials such that a lowest energy level of a conduction band of both said layers is respectively greater than a lowest energy level of the conduction band of the quantum well and of the electron storage layer.

13. An electromagnetic wave detector according to claim 11, wherein a decreasing profile of the lowest energy level of the conduction band of the transfer barrier layer is obtained with a semiconductor alloy having a composition varying from the quantum well to the electron storage layer.

14. An electromagnetic wave detector according to claim 11, wherein the decreasing profile of the lowest energy level of the conduction band of the transfer barrier layer is obtained by a presence, in the stack of layers made of semiconductor materials, of a piezoelectric semiconductor material creating a natural electrical field.

15. An electromagnetic wave detector according to claim 11, wherein the stack of layers made of semiconductor materials comprises a first layer and a second layer of doped semiconductor materials on either side of the unit constituted by the electron storage layer/transfer barrier/quantum well so as to enable a creation of an electric field responsible for the decreasing profile of the lowest energy level of the conduction band of the transfer barrier layer.

16. An electromagnetic wave detector according to claim 11, wherein the counting unit is configured to carry out a measurement of a photocurrent in a plane of the electron storage layer.

17. An electromagnetic wave detector according to claim 15, further comprising the following stack of layers of semiconductor materials, starting from a surface of a semiconductor substrate:

a first barrier layer;

a quantum well;

a second barrier layer that is a transfer barrier layer;

an electron storage layer;

a third barrier layer;

the first and second ohmic contacts extending from the third barrier layer up to the electron storage layer.

18. An electromagnetic wave detector according to claim 16, comprising the following stack of layers of semiconductor materials, starting from a surface of a semiconductor substrate:

a third barrier layer;

an electron storage layer;

a second barrier layer that is a transfer barrier layer;

an electron storage layer;

a first barrier layer;

and a mesa defined in:

the transfer barrier layer;

the quantum well;

the first barrier layer;

the first and second ohmic contacts being located on either side of the mesa.

19. An electromagnetic wave detector according to claim 11, wherein the counting unit comprises:

a first ohmic contact; and a second ohmic contact, both of the first and second ohmic contacts being located respectively in the quantum well and in the electron storage layer so as to carry out a photovoltaic reading of a voltage set up between electrons of the quantum well and electrons of the storage well.

20. An electromagnetic wave detector according to claim 19, comprising the following stack of semiconductors materials starting from semiconductor substrate:

a first barrier layer;

a quantum well;

a second barrier layer that is a transfer barrier layer, an electron storage layer;

a third barrier layer;

and an etching up to the level of the transfer barrier layer so as to make the first ohmic contact extending up to the quantum well and the second ohmic contact extending up the electron storage layer.

21. An electromagnetic wave detector according to claim 11, further comprising a resetting unit configured to reset the flow of the electrons in the storage layer.

22. An electromagnetic wave detector according to claim 11, comprising third and fourth contacts located on either side of the stack of layers of semiconductor materials.

* * * * *